(12) United States Patent
Oezyilmaz et al.

(10) Patent No.: US 11,848,037 B2
(45) Date of Patent: Dec. 19, 2023

(54) METHOD OF PROTECTING A MAGNETIC LAYER OF A MAGNETIC RECORDING MEDIUM

(71) Applicant: National University of Singapore, Singapore (SG)

(72) Inventors: Barbaros Oezyilmaz, Singapore (SG); Andreas Volker Stier, Singapore (SG); Chee Tat Toh, Singapore (SG); Antonio Helio Castro Neto, Singapore (SG)

(73) Assignee: National University of Singapore, Singapore (SG)

( * ) Notice: Subject to any disclaimer, the term of this patent is extended or adjusted under 35 U.S.C. 154(b) by 211 days.

(21) Appl. No.: 15/223,915

(22) Filed: Jul. 29, 2016

(65) Prior Publication Data

US 2017/0032815 A1    Feb. 2, 2017

Related U.S. Application Data

(60) Provisional application No. 62/198,422, filed on Jul. 29, 2015.

(51) Int. Cl.
*C23C 16/48* (2006.01)
*G11B 5/84* (2006.01)
*G11B 5/72* (2006.01)

(52) U.S. Cl.
CPC .......... *G11B 5/8408* (2013.01); *C23C 16/483* (2013.01); *G11B 5/722* (2013.01)

(58) Field of Classification Search
CPC .................................................... C23C 16/483
See application file for complete search history.

(56) References Cited

U.S. PATENT DOCUMENTS

| | | | |
|---|---|---|---|
| 4,579,750 A | * | 4/1986 | Bowen ............... B01J 19/121 118/50.1 |
| 4,986,214 A | | 1/1991 | Zumoto et al. |
| 5,308,651 A | * | 5/1994 | Ohta ................. H01L 21/268 257/E21.347 |
| 5,731,046 A | * | 3/1998 | Mistry ............... B23K 26/0604 427/249.7 |
| 6,219,469 B1 | | 4/2001 | Minakata et al. |
| 7,850,863 B2 | | 12/2010 | Zenasni |
| 8,026,165 B2 | | 9/2011 | Zenasni |
| 8,133,548 B2 | | 3/2012 | Zenasni |
| 8,231,797 B2 | | 7/2012 | Jousseaume et al. |

(Continued)

FOREIGN PATENT DOCUMENTS

| | | |
|---|---|---|
| CN | 103288073 A | 9/2013 |
| JP | 2006035174 A | 2/2006 |

(Continued)

OTHER PUBLICATIONS

Lee ACS Nano Dec. 2010 p7524 (Year: 2010).*

(Continued)

*Primary Examiner* — Joseph A Miller, Jr.
(74) *Attorney, Agent, or Firm* — Ajay A. Jagtiani; Miles & Stockbridge P.C.

(57) ABSTRACT

A method of protecting a magnetic layer of a magnetic recording medium is provided to reduce the thickness of the magnetic spacing while improving corrosion resistance and tribological performance of the magnetic recording medium.

19 Claims, 5 Drawing Sheets

(56) References Cited

U.S. PATENT DOCUMENTS

| | | | |
|---|---|---|---|
| 8,367,118 | B2 | 2/2013 | Curatolo et al. |
| 8,512,669 | B2 | 8/2013 | Hauck |
| 8,617,669 | B1 | 12/2013 | Quick et al. |
| 8,617,965 | B1 | 12/2013 | Quick et al. |
| 8,623,466 | B2 | 1/2014 | Zenasni |
| 8,637,118 | B2 | 1/2014 | Zenasni |
| 8,647,669 | B2 | 2/2014 | Soscia et al. |
| 8,999,440 | B2 | 4/2015 | Zenasni et al. |
| 9,159,550 | B2 | 10/2015 | Zenasni |
| 2002/0063673 | A1 | 5/2002 | Kawai |
| 2004/0109814 | A1* | 6/2004 | Simard ............... B82Y 40/00 423/447.1 |
| 2009/0322319 | A1* | 12/2009 | Kreupl ............... B82Y 10/00 324/207.21 |
| 2010/0012032 | A1 | 1/2010 | Chen |
| 2010/0247801 | A1 | 9/2010 | Zenasni |
| 2011/0030879 | A1 | 2/2011 | Veerasamy |
| 2011/0151278 | A1 | 6/2011 | Gurney et al. |
| 2011/0195207 | A1 | 8/2011 | Hong et al. |
| 2011/0244662 | A1 | 10/2011 | Lee et al. |
| 2012/0021249 | A1 | 1/2012 | Shin et al. |
| 2012/0026816 | A1 | 2/2012 | Roohparvar |
| 2012/0040145 | A1 | 2/2012 | Zenasni et al. |
| 2012/0048195 | A1 | 3/2012 | Lin |
| 2012/0068161 | A1 | 3/2012 | Lee et al. |
| 2012/0088039 | A1 | 4/2012 | Yu et al. |
| 2012/0118368 | A1 | 5/2012 | Huang et al. |
| 2012/0132353 | A1 | 5/2012 | Hauck |
| 2012/0156424 | A1 | 6/2012 | Chen et al. |
| 2013/0127023 | A1 | 5/2013 | Zenasni |
| 2013/0202813 | A1 | 8/2013 | Chueh et al. |
| 2013/0240033 | A1 | 9/2013 | Jeon et al. |
| 2013/0323158 | A1 | 12/2013 | Xu et al. |
| 2014/0239461 | A1 | 8/2014 | Delabie et al. |
| 2016/0148633 | A1* | 5/2016 | Hasegawa ............ G11B 5/72 360/125.02 |
| 2016/0222502 | A1* | 8/2016 | Gondal ............... B01J 35/004 |
| 2016/0258081 | A1 | 9/2016 | Ozyilmaz et al. |
| 2016/0340783 | A1* | 11/2016 | Lu ........................ C23C 16/483 |
| 2016/0340797 | A1 | 11/2016 | Ozyilmaz et al. |

FOREIGN PATENT DOCUMENTS

| | | |
|---|---|---|
| JP | WO2011021715 A1 | 1/2013 |
| JP | 2013513544 A | 4/2013 |
| KR | 20120045100 A | 5/2012 |
| WO | 2011021715 A1 | 2/2011 |
| WO | 2012044284 | 4/2012 |
| WO | 2012164259 | 12/2012 |
| WO | 2013138216 A1 | 9/2013 |
| WO | 2013141817 | 9/2013 |
| WO | 2014027529 A1 | 2/2014 |
| WO | 2015072927 | 5/2015 |
| WO | 2015119572 | 8/2015 |

OTHER PUBLICATIONS

Bunch, J. S. et al. "Impermeable atomic membranes from graphene sheets", Nano Letters 8, 2458-2462 (2008).

Schriver, M. et. al. "Graphene as long-term metal oxidation barrier: Worse than nothing" ACS Nano, 2013, 7 (7), pp. 5763-5768, DOI: 10.1021/nn4014356.

Li, X. et. al. "Large area synthesis of high-quality and uniform graphene films on copper foils", Science 324 (5932), 1312-1314, 2009.

Hao, Y. et. al. "The role of surface oxygen in the growth of large scale single crystal graphene on copper" Science 342 (6159), 720-723, 2013.

Liu, Z. et. al. "Ultrathin high-temperature oxidation-resistant coatings of hexagonal boron nitride", Nature Communications 4, doi:10.1038/ncomms3541, 2013.

Malaysian Search Report, Application No. PI 2016001411, dated Aug. 1, 2019.

Choi et al., "Laser-Induced Solid-Phase Doped Graphene", ACS Nano, 2014, 8, 8, pp. 7671-7677.

Lee et al., "Laser-Synthesized Epitaxial Graphene", ACS Nano, 2010, 4, 12, pp. 7524-7530.

Hwang et al., "Electrical characteristics of wrinkle-free graphene formed by laser graphitization of 4H—SiC", Applied Physics Letters 99, 082111 (2011).

Kim et al., "Modeling of the self-limited growth in catalytic chemical vapor deposition of graphene", New Journal of Physics, 15, 2013, 16 pages.

Notification of the Transmittal of the International Search Report and Written Opinion for International Application No. PCT/SG2014/000522, "Flexible Electrochromic Films With Graphene/Ferroelectric Material", dated Jan. 30, 2015.

Dhar, S., et al., "A new route to graphene layers by selective laser ablation", AID Advances, 1, 022109 (2011).

Huang et al., "Grains and grain boundaries in single-layer graphene atomic patchwork quilts", vol. 469, Nature, Jan. 20, 2011, 5 pages.

International Preliminary Report on Patentability dated May 17, 2016 for International Application No. PCT/SG2014/000540 entitled "Ordered Growth of Large Crystal Graphene by Laser-Based Localized Heating for High Throughput Production".

International Search Report and Written Opinion of the International Searching Authority dated Feb. 5, 2015 for International Application No. PCT/SG2014/000540 entitled "Ordered Growth of Large Crystal Graphene by Laser-Based Localized Heating for High Throughput Production".

International Search Report and Written Opinion of the International Searching Authority dated Apr. 16, 2015 for International Application No. PCT/SG2015/000029 entitled "Method of Pulsed Laser-Based Large Area Graphene Synthesis on Metallic and Crystalline Substrates".

Kumar, P., "Laser flash synthesis of graphene and its inorganic analogues: An innovative breakthrough with immense promise," RCS Advances, 2013, 3, 11987-12002.

Lee, J-H., et al., "Wafer-Scale Growth of Single-Crystal Monolayer Graphene on Reusable Hydrogen-Terminated Germanium", Science, 344: 286-289 (Apr. 18, 2014).

Park, J.B, et al., "Fast growth graphene patterns by laser direct writing," Applied Physics Letters 98, 123109-1-3 (2011).

Park, J.B. et al., "Transparent interconnections formed by rapid single-step fabrication of graphene patterns," Applied Physics Letters 99, 053103-1-3 (2011).

Navid et al., "The effect of ultraviolet lasers on conversion of methane into higher hydrocarbons," Laser and Particle Beams, 31, 481-486, 2013.

Wang, K., "Laser Based Fabrication of Graphene", Intech, 77-95 (2013).

Wei, D., et al., "Laser direct synthesis of graphene on quartz", Carbon, 53 (2013) 374-379.

Fan, L. et al. "Laser direct writing graphene patterns on SiO2/Si substrates" Proc. SPIE 8608, Laser-based Micro- and Nanopackaging and Assembly VII, 86060J (Mar. 15, 2013) doi101117122001405 ISSN 0277786X ISBN 9781510607538 p. 86080J XP055383298.

Koh, A. et al. "Cooling rate and energy dependence of pulsed laser fabricated graphene on nickel at reduced temperature" Applied Physics Letters A I P Publishing LLC US (Sep. 14, 2010) vol. 97, No. 11, doi10106313489993 ISSN 00036951 pp. 114102 114102 XP012136930.

Wang, G. et al. "Direct Growth of Graphene Film on Germanium Substrate" Scientific Reports, vol. 3: 2465 (2013) doi101038srep02465 XP055267329.

International Preliminary Report on Patentability dated Aug. 9, 2016 for International Application No. PCT/SG2015/000029 entitled "Method of Pulsed Laser-Based Large Area Graphene Synthesis on Metallic and Crystalline Substrates".

Suemitsu, M. et al. "Epitaxial graphene on silicon substrates" Journal of Physics D Applied Physics Institute of Physics Publishing LTD GB (Sep. 2, 2010) vol. 43, No. 37, doi101088002237274337374012 ISSN 00223727 p. 374012 XP020196821.

Baeri et al. "Segregation effects in cu implanted si after laser pulse melting" Phys Rev Lett vol. 41, No. 18 (Oct. 30, 1978).

(56) References Cited

OTHER PUBLICATIONS

Grantab et al. "Anomalous strength characteristics of tilt grain boundaries in graphene" Science vol. 330, Is 6006 (Nov. 12, 2010).
Wei et al., "Laser direct growth of graphene on silicon substrate" Appl. Phys Lett 100 (Jan. 10, 2012).
Nie et al. "Origin of the mosaicity in graphene grown on Cu(111)" Phy Rev B84 (2011).
Notification Concerning Transmittal of International Preliminary Report on Patentability for International Application No. PCT/SG2014/000522, "Flexible Electrochromic Films With Graphene/Ferroelectric Material", dated May 19, 2016.
Malik, M., et al., "Effect of Nematic Liquid Crystals on Optical Properties of Solven Induced Phase Separated PDLC Composite Films", Indian Journal of Science and Technology, 5(10): 3440-3452 (date unavailable).
Akins, R., et al., "Effect of thickness on PDLC electro-optics", Proc. SPIE, 1665, liquid Crystal Materials, Devices, and Applications, 280 (Jun. 15, 1992); doi: 10.1117/12.60396.
Challa, S., et al., "Thermal induced phase separation of E7/PMMA PDLC system", Journal of Thermal Analysis, 45: 1297-1312 (1994).
Luntz et al., "Review Article: Dynamics of methane dissociation of transition metals," J. Vac. Sci. Technol. A 35(5), 2017.

\* cited by examiner

METHOD OF PROTECTING A MAGNETIC LAYER OF A MAGNETIC RECORDING MEDIUM

CROSS-REFERENCE TO RELATED APPLICATIONS

This application claims priority to and the benefit of U.S. Provisional Patent Application Ser. No. 62/198,422, filed Jul. 29, 2015, entitled "MAGNETIC DATA STORAGE MEDIUM WITH ATOMICALLY THIN CORROSION PROTECTION LAYER AND MAKING THEREOF," by Andreas Volker STIER, et al. which is incorporated herein by reference in its entirety for all purposes.

TECHNICAL FIELD

The present invention relates to a method of protecting a magnetic layer of a magnetic recording medium.

BACKGROUND

Hard disk drives comprise a magnetic medium and a read-write head, flying a few nanometers above the surface of the magnetic medium, which is responsible for writing and recovering the recorded data on the disk drive. The surfaces of the magnetic medium and the head require to be protected against corrosion and mechanical damage such as wear and tear especially when intermittent contact happens between the head and the magnetic medium. The present form of this protection is coating these surfaces with overcoats of a thin, continuous and hard material and a lubricant layer.

The demand for higher areal densities (number of bits/unit area on a disk surface) in the magnetic hard disk drives has been consistently increasing. One way of achieving higher areal density is to reduce the thickness of the overcoats. However, decreasing the thickness of the overcoats may give rise to other problems such as a reduction in the tribological and anti-corrosion performance.

Conventional corrosion protection layers are made of thermally deposited amorphous carbon thin films that effectively protect the magnetic medium from galvanic corrosion for thicknesses above 1.2 nm. Below such thickness, the material is ineffective as a corrosion protection layer. US 2011/0151278 teaches the use of a graphene layer on a nucleation layer to reduce the thickness of the corrosion protection layer. However, it would be clear to a skilled person from the teachings of US 2011/0151278 that it is essential for a nucleation layer to be provided in order to form the graphene layer.

Current technologies for fabricating large-scale graphene, such as chemical vapour deposition (CVD) or conventional laser based deposition methods, are not compatible with the stringent temperature requirements of the magnetic medium because typical large-scale graphene deposition methods require heat of about 800-1000° C. for a considerable amount of time and a catalytic substrate for growth. Such conditions render conventional large-scale methods unsuitable for forming a corrosion protection layer for magnetic recording media since the high temperatures would reduce the magnetic properties of the magnetic layer.

Other methods of applying a graphene layer on a magnetic layer include transferring high quality graphene. However, the transferred graphene layer comprise transfer-induced wrinkles that inevitably increase the magnetic head fly height or transfer-induced cracks that result in effective corrosion protection only for few layer graphene layers, which is detrimental for reducing the thickness of the corrosion protection layer. Other challenges such as adhesion of the graphene to the magnetic layer, removal of oxidation layers and removal of residues from the graphene transfer process are also detrimental to the magnetic metal layers.

There is therefore a need for an improved method of forming an overcoat on a magnetic recording medium which has improved corrosion resistance while being able to maintain the tribological properties of the magnetic recording medium.

SUMMARY OF THE INVENTION

The present invention seeks to address these problems, and/or to provide an improved magnetic recording medium.

In general terms, the invention relates to a method of directly forming a thin protection layer formed on a magnetic layer of a magnetic recording medium, wherein the method involves low-temperature and therefore does not affect the magnetic properties of the underlying magnetic layer. The protection layer provides protection to the magnetic layer against wear and mechanical damage, as well as acts as a diffusion barrier to prevent corrosion of the magnetic layer without compromising on the tribological properties. Further, since the protection layer is formed directly on the magnetic layer, problems associated with mechanical damage of an otherwise transferred layer are prevented.

According to a first aspect, the present invention provides a method of protecting a surface of a magnetic layer of a magnetic recording medium comprising forming a corrosion protection layer directly on the magnetic layer, the corrosion protection layer comprising a two-dimensional (2D) material, wherein the forming is by laser-based chemical vapour deposition (laser-based CVD).

The 2D material may comprise any suitable material. For example, the 2D material may comprise graphene, boron nitride (BN), or a combination thereof. In particular, the 2D material may comprise graphene.

The corrosion protection layer may have any suitable thickness. For example, the thickness of the corrosion protection layer may be 1.2 nm.

According to a particular aspect, the method may further comprise depositing a lubricant layer on the corrosion protection layer.

According to a particular aspect, the method may further comprise patterning, electrically contacting and/or functionalising the corrosion protection layer. In particular, the functionalising may comprise molecular doping and/or chemical doping of the corrosion protection layer.

The laser-based CVD to form the corrosion protection layer may be under suitable conditions. For example, the laser-based CVD may be carried out at a low temperature such as a temperature 300° C.

The laser-based CVD may comprise a step of injecting a gas into a vacuum chamber comprising the magnetic recording medium, decomposing the gas to generate at least one decomposed species and depositing the at least one decomposed species on the magnetic layer to form the corrosion protection layer comprising the 2D material. The gas injected into the vacuum chamber may be any suitable gas, depending on the 2D material to be comprised in the corrosion protection layer. For example, the gas may be, but is not limited to: $CH_4$, $C_2H_2$, $C_2H_4$, $C_6H_6$, $NH_3$, $B_2H_6$, $BCl_3$, $BF_3$, or a combination thereof. Other non-reactive gases may also be injected into the vacuum chamber. Examples of non-reactive gases which may be injected to the vacuum chamber include, but are not limited to, hydrogen, argon, or a combination thereof. According to a particular aspect, when the corrosion protection layer comprises graphene, the gas may be CH4, C2H2, C2H4 and/or C6H6. According to another particular aspect, when the corrosion protection layer comprises BN, the gas may be NH3 and either one or more gas selected from, but not limited to: B2H6, BCl3, BF3.

According to a particular aspect, during the laser-based CVD, the depositing may be on a specific surface area of the magnetic layer irradiated by a laser beam.

The method of the present application may be applied to existing hard disk drives or to future hard disk drives to achieve higher areal densities, as well as better protection against wear, corrosion and an increased thermal stability of the magnetic medium.

A second aspect of the present invention provides a magnetic recording medium comprising a substrate and a magnetic layer, wherein a surface of the magnetic layer is protected by a corrosion protection layer formed on the surface of the magnetic layer by the method of the first aspect.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings. In the drawings.

DETAILED DESCRIPTION

The present invention provides an improved method of protecting a magnetic recording medium. The magnetic recording medium may be used in hard disk drives, magnetic tapes, magnetic read heads, and the like. In particular, the magnetic recording medium to which the method of the present invention is applied may have a higher resistance to corrosion and improved tribological performance. Further, the magnetic recording medium to which the method of the present invention is applied may have higher areal density compared to conventional magnetic recording media.

The method of the present invention involves directly forming a thin protection layer to be formed on a magnetic layer of a magnetic recording medium, wherein the method involves low-temperature and therefore does not affect the magnetic properties of the underlying magnetic layer. The protection layer provides protection to the magnetic layer against wear and mechanical damage, as well as acts as a diffusion barrier to prevent corrosion of the magnetic layer without compromising on the tribological properties. Further, since the protection layer is formed directly on the magnetic layer, problems associated with mechanical damage of an otherwise transferred layer are prevented.

Figure 1:
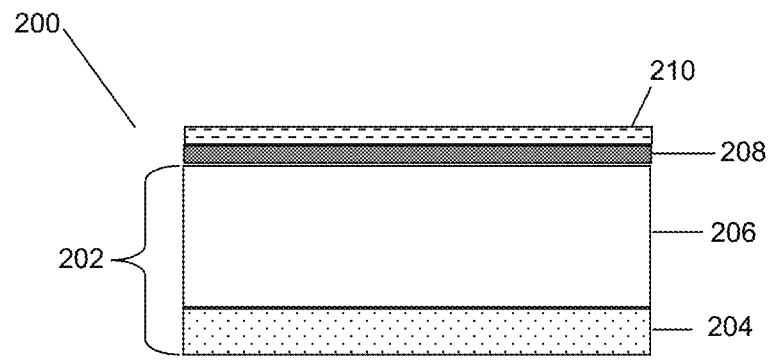
FIG. 1 shows a cross-sectional view of a magnetic recording medium according to a particular embodiment of the present invention.

FIG. 1 shows a magnetic device 200 comprising a magnetic recording medium 202. The magnetic recording medium 202 comprises a substrate 204, a magnetic layer 206 disposed on the substrate 204 and a corrosion protection layer 208. Optionally, a lubricant layer 210 may be disposed on the corrosion protection layer 208.

The magnetic device 200 may be any suitable device. For example, the magnetic device 200 may be any device which comprises a magnetic recording medium such as magnetic recording medium 202. The magnetic device may include, but is not limited to, a magnetic hard disk, a magnetic tape, and magnetic read head.

The substrate 204 may be any suitable substrate. In particular, the substrate may be a non-magnetic substrate. For example, the substrate may be made of glass or glass-ceramic, metal alloys such as aluminum alloys and NiP/Al, plastic or polymer material, ceramic, glass-polymer, composite materials or other non-magnetic materials.

The magnetic layer 206 may be composed of any suitable material. In particular, the magnetic layer 206 may be a layer which includes ferromagnetic materials which may be used, for example, as a recording medium in a magnetic device. For example, the magnetic layer 206 may be composed of any one of, but not limited to, cobalt, chromium, iron, platinum, nickel, titanium, tungsten, silicon, aluminum, iron, ruthenium, tantalum or combinations thereof, such as a cobalt-based alloy, a chromium-based alloy or an iron-based alloy, like Co—Cr—Pt, CoCrPtB, or FePt. The magnetic layer 206 may be composed of a single layer or thin multiple layers of one or more material stacked on top of each other. The magnetic layer 206 may be sputtered onto the substrate 204.

Overcoats are provided on magnetic layers of conventional magnetic recording medium for protecting the magnetic recording medium against corrosion and for lowering the friction during an intermittent contact between the magnetic recording medium and the read-write head. Conventionally, overcoats comprise a thick protective layer of diamond-like carbon (DLC) and a lubricant layer. However, such overcoats may not be thermally stable and therefore be unsuitable for hard disk drives manufactured using the heat assisted magnetic recording (HAMR) technology. Further, conventional carbon overcoats which are modified to be ultrathin, in order to achieve an increase in areal density of the hard disk drive, are not as effective as a diffusion barrier to prevent corrosion in the same way as thicker carbon overcoats.

In the present invention, as shown in FIG. 1, the corrosion protection layer 208 replaces the traditional overcoat. The advantage of the corrosion protection layer 208 is that it comprises a corrosion resistant material which is wear resistant, while itself remaining ultrathin since the overall thickness of the corrosion protection layer 208 is to be 1.2 nm. In this way, the corrosion protection layer 208 is able to achieve the high areal densities which ultrathin carbon overcoats were able to achieve while also being corrosion and wear resistant.

While the corrosion protection layer 208 provides suitable corrosion resistance to the magnetic layer 204, it may be necessary to include a further protective lubricant layer 210. The lubricant layer 210 protects a magnetic disk rotating at high speeds with the magnetic head flying at a height less than 10 nm away from the surface of the disk.

The lubricant layer 210 may be composed of any suitable material. For example, the lubricant layer 210 may be composed of a fluorine-based lubricant. The lubricant layer 210 may be deposited on the corrosion protection layer 208 by any suitable method. For example, the method for depositing the lubricant layer 210 may comprise, but is not limited to, vapour deposition or dip-and-pull method.

As a result of a reduction of the thickness of the corrosion protection layer 208 as compared to traditional overcoats, the head-media spacing (HMS) is reduced. This reduction in the HMS may result in an increase in the areal density of the magnetic recording device 200 such as the hard disk drive.

The corrosion protection layer 208 may be formed directly on the magnetic layer 206 using the method of the present invention. Accordingly, a first aspect of the present invention provides a method of protecting a surface of the magnetic layer 206 of the magnetic recording medium 202. The formation of the corrosion protection layer 208 is described in detail in relation to steps 406 and 408 of the method 400 shown in FIG. 2.

Figure 2:
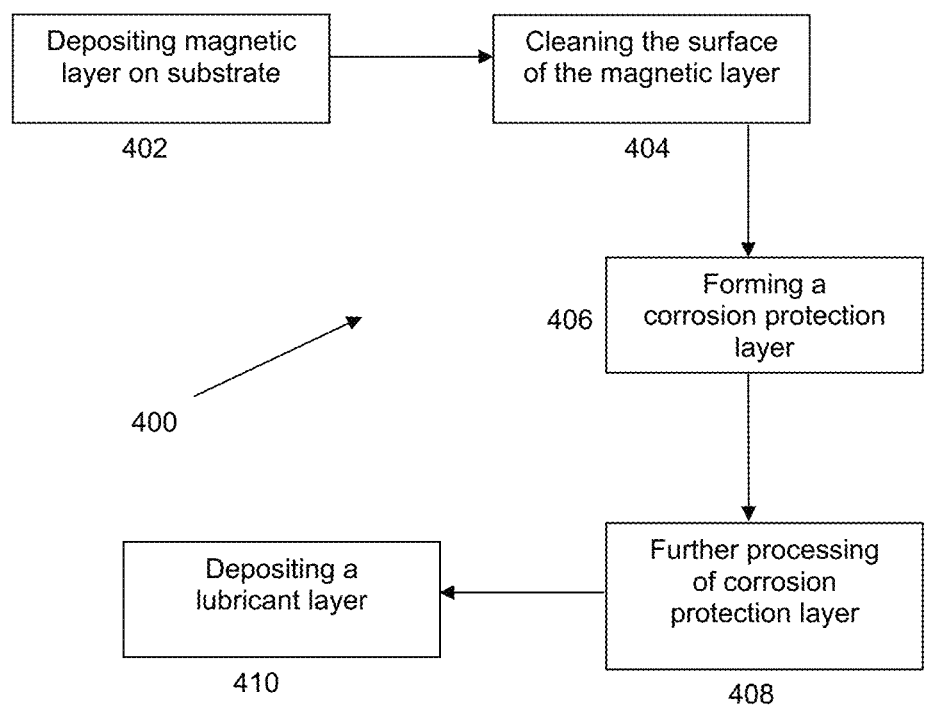
FIG. 2 shows a flow chart of the steps for a fabrication of a magnetic device containing a corrosion protection layer according to a particular embodiment of the present invention.

A method 400 of treating a surface of a magnetic layer 206 of a magnetic recording medium 202 will now be described with reference to FIG. 2.

Step 402 comprises depositing a magnetic layer on a substrate. The magnetic layer and the substrate may be as described above in relation to the magnetic layer 206 and the substrate 204. Any suitable process for depositing the magnetic layer 206 on the substrate 204 may be used for the depositing of step 402. For example, the step 402 may be carried out by sputtering. The step 402 may be carried out in an inert gas atmosphere, such as an atmosphere of pure argon.

Once the magnetic layer 206 is deposited on the substrate 204, the surface of the magnetic layer 206 is optionally cleaned according to step 404. The step 404 comprises cleaning the surface of the magnetic layer 206 using any suitable solvent. For example, the solvent may be, but not limited to, isopropyl alcohol (IPA). The step 404 may also comprise etching a surface of the magnetic layer 206 by Ar+ ion beam or plasma etching to remove any surface oxide. The etching may not be necessary if step 402 and subsequent step 406 are performed in-situ in the same vacuum chamber.

The cleaned surface of the magnetic layer 206 is then subjected to a step 406 which comprises forming a corrosion protection layer on the magnetic layer 206. The corrosion protection layer may be as described above in relation to the corrosion protection layer 208.

The step 406 comprises forming the corrosion protection layer 208 directly on the magnetic layer 206 by laser-based CVD. In particular, the step 406 comprises forming the corrosion protection layer 208 by laser-based CVD which is carried out at a low temperature such as 300° C. In particular, the laser-based CVD is carried out at a temperature of 20-300° C., 25-290° C., 30-285° C., 50-275° C., 75-250° C., 100-225° C., 110-215° C., 125-200° C., 130-190° C., 145-180° C., 150-175° C., 155-160° C. Even more in particular, the laser-based CVD is carried out at a temperature of about 100-300° C. For example, at temperatures 200° C., magnetic properties of the magnetic layer 206 are preserved, while at temperatures of about 300° C., a high quality of corrosion protection layer 208 is formed. Therefore, a suitable temperature is required to form the corrosion protection layer 208.

The corrosion protection layer 208 formed by step 406 comprises a two-dimensional (2D) material. For the purposes of the present invention, a 2D material is defined as a crystalline material consisting of a single layer of atoms or up to 5 atomic layers. The 2D material may comprise any suitable material. For example, the 2D material may comprise graphene, boron nitride (BN), or a combination thereof. In particular, the 2D material may comprise graphene. For the purposes of the present invention, graphene may be defined to include, but not limited to, pure graphene, or functionalised graphene such as hydrogen bonded graphene (graphane), halogenated graphene such as fluorinated graphene, and graphene oxide.

The laser-based CVD to form the corrosion protection layer may be under suitable conditions. According to a particular aspect, the laser-based CVD may comprise a step of injecting a gas into a vacuum chamber comprising the magnetic recording medium 202, decomposing the gas to generate at least one decomposed species and depositing the at least one decomposed species on the magnetic layer 206 to form the corrosion protection layer 208 comprising the 2D material. The gas injected into the vacuum chamber may be any suitable gas, depending on the 2D material to be comprised in the corrosion protection layer 208.

The gas injected into the vacuum chamber may be, but is not limited to: $CH_4$, $C_2H_2$, $C_2H_4$, $C_6H_6$, $NH_3$, $B_2H_6$, $BCl_3$, $BF_3$, and a combination thereof. Other non-reactive gases may also be injected into the vacuum chamber. Examples of non-reactive gases which may be injected to the vacuum chamber include, but are not limited to, hydrogen, argon, or a combination thereof. According to a particular aspect, when the corrosion protection layer 208 comprises graphene, the gas may be any carbon-containing gas, such as $CH_4$, $C_2H_2$, $C_2H_4$ and/or $C_6H_6$. According to another particular aspect, when the corrosion protection layer 208 comprises BN, the gas may comprise any suitable nitride-containing gas and any suitable boron-containing gas. In particular, when the corrosion protection layer 208 comprises BN, the gas may comprise $NH_3$ and either one or more gas selected from, but not limited to: $B_2H_6$, $BCl_3$, $BF_3$.

According to a particular aspect, during the laser-based CVD, the depositing on the magnetic layer 206 may be on a specific surface area of the magnetic layer 206 irradiated by a laser beam.

Figure 3:
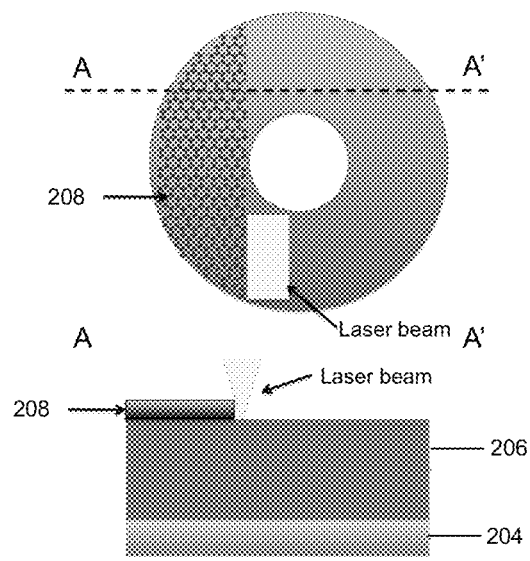
FIG. 3 shows a formation of a corrosion protection layer on a magnetic recording medium according to a particular embodiment of the present invention.

Examples of the formation of the corrosion protection layer 208 of step 406 are shown in FIGS. 3 to 7. FIG. 3 shows a corrosion protection layer 208 comprising single layer graphene formed on the surface of the magnetic layer 206 via low temperature laser-based CVD. The graphene may be in the form of planar sp-2 bonded carbon sheet with a thickness of up to three atomic layers or a thickness of 1.2 nm.

A magnetic disc containing the substrate 204 and the magnetic layer 206 is placed in a vacuum chamber with the surface of the magnetic layer 206 perpendicular to an impinging laser beam. The substrate 204 may be held at a fixed temperature up to 300° C. for a pre-determined amount of time. The pre-determined amount of time may be 1 second-10 minutes. In particular, the pre-determined amount of time may be 30 seconds-8 minutes, 1-7 minutes, 2-6 minutes or 3-5 minutes.

The laser beam may be of any suitable shape. In particular, the laser beam is of a shape which is suitable for the coverage of the size and shape of the magnetic layer 206 on the substrate 204. The laser beam may cover the entire surface of the magnetic layer 206 on substrate 204 by rastering or by moving the substrate 204.

The laser beam may be generated from a suitable source. In particular, the laser beam may be from a source that may produce pulses of laser light of length tpulse in the range 1-100 ns with a centre wavelength in the ultraviolet (UV) region of the light spectrum, i.e. between 190-400 nm. For example, the centre wavelength may be about 193 nm, 248 nm, 308 nm or 351 nm. The source or the optical elements in the laser beam path of the laser beam may be controlled such that the fluence of the pulse may be controlled. The fluence of each pulse may be 10-100 millijoules/cm2 (mJ/cm2) for maximum illumination of the magnetic disc. The position of the laser beam may be controlled in such a way that each part of the surface of the magnetic layer 206 on substrate 204 may be illuminated with a pre-determined number of pulses and fluence in a range set by the apparatus used.

The vacuum chamber may be connected to a vacuum system of suitable pressure. In particular, the vacuum chamber is set to maintain a pressure of $1.0\times10^{-3}$ torr or lower. Even more in particular, the pressure may be $1.0\times10^{-3}$-$1.0\times10^{-6}$ torr. The vacuum of the chamber may be controlled. In particular, different reactive gases may be introduced in a controlled manner into the vacuum chamber such that a homogeneous concentration of the reactive gases may be maintained. For graphene growth, methane ($CH_4$) gas, acetylene ($C_2H_2$) gas, ethylene ($C_2H_4$) gas and/or benzene ($C_6H_6$) gas may be introduced together with hydrogen. The chamber environment may be further controlled with an inert gas such as argon. The laser pulse decomposes the carbon-containing gas in a way that the fluence of the laser pulse on the magnetic layer 206 on the substrate 204 is controlled so as to be lower than the ablation threshold for graphene ablation on the particular substrate 204 or such that the substrate temperature is not raised above 300° C., whichever requires a lower fluence. A graphene nucleation site grows outwards on the surface of the magnetic layer 206 on substrate 204 and guidance of the laser beam spot across the surface of the magnetic layer 206 ensures complete coverage of the surface of the magnetic layer 206 with a corrosion protection layer 208 comprising graphene. In particular, the corrosion protection layer 208 comprising graphene grows on the specific area that it is irradiated by the laser beam.

If the corrosion protection layer 208 comprises BN, a nitride-containing gas such as $NH_3$ and a boron-containing gas such as $B_2H_6$, $BCl_3$ and/or $BF_3$ may be introduced into the vacuum chamber. Similar to the method described above in relation to graphene, a corrosion protection layer 208 comprising BN will be formed on the surface of the magnetic layer 206. The corrosion protection layer 208 may be an electrical insulating layer if the corrosion protection layer 208 comprises BN. The corrosion protection layer 208 comprising BN may be a crystalline-layered boron nitride film with a thickness of up to 3 unit cells. In particular, the laser beam irradiates the surface of the magnetic layer 206 and the reactive gases are decomposed by the laser radiation to form BN. A person skilled in the art may determine the most appropriate stoichiometric mixture of the gases utilized. The fluence of the laser beam is not to exceed the ablation threshold of BN on the respective magnetic medium as well as not to exceed a substrate temperature of 300° C.

Figure 4:
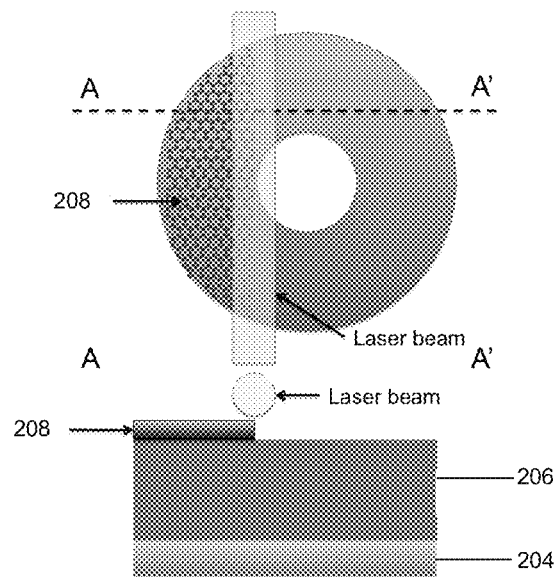
FIG. 4 shows a formation of a corrosion protection layer on a magnetic recording medium according to a particular embodiment of the present invention.

Referring to FIG. 4, the corrosion protection layer 208 may be grown on top of the magnetic layer 206 by a method in which the laser beam is guided in parallel to the surface of the magnetic layer 206. The distance between the surface of the magnetic layer 206 and the laser beam path may be controlled. The laser beam does not impinge on the magnetic recording medium 202 and therefore the fluence in this growth mode may be larger than the ablation threshold. The laser beam may decompose the seed gas fed into the vacuum chamber for the formation of the corrosion protection layer 208 and the corrosion protection layer 208 may form on the surface of the magnetic layer 206 underneath the laser beam. The laser may be focused to a point above the surface of the magnetic layer 206 in order to increase the intensity at this point. Full coverage of the surface of the magnetic layer 206 may be achieved through relative movement of the substrate 204 with respect to the laser beam. Temperature and pressure requirements may be similar to those as described in the formation method in relation to FIG. 3.

Figure 5:
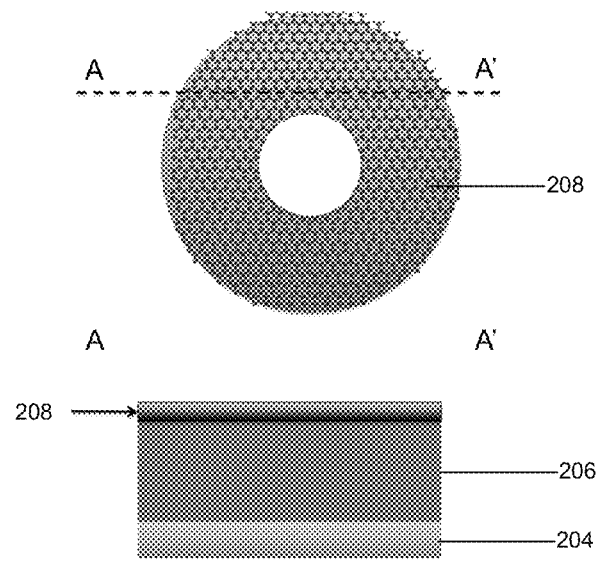
FIG. 5 shows a formation of a corrosion protection layer on a magnetic recording medium according to a particular embodiment of the present invention.

Referring to FIG. 5, a full coverage of the surface of the magnetic layer 206 with a corrosion protection layer 208 is achieved by relative movement of the laser and the substrate 204. Further, a combination of the direct focusing growth method as described in relation to FIG. 3 and parallel beam path growth method as described in relation to FIG. 4 may be applied for optimum surface coverage. In particular, the combination of the direct focusing method and the parallel beam path growth method comprises guiding the laser beam at an intermediate angle between being parallel and perpendicular relative to the surface of the magnetic layer 206.

Figure 6:
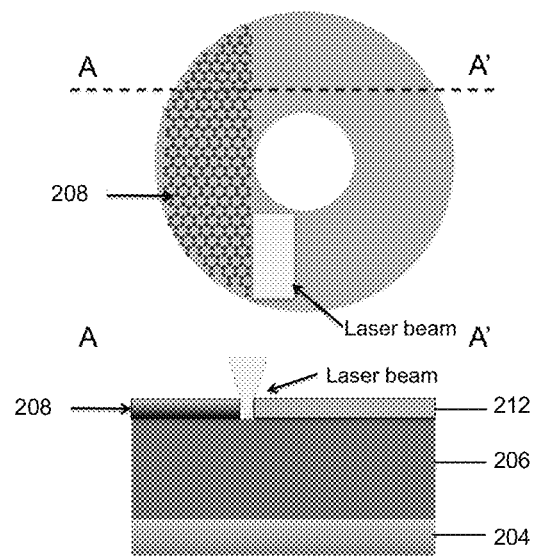
FIG. 6 shows a formation of a corrosion protection layer on a magnetic recording medium according to a particular embodiment of the present invention.

In the particular embodiment as shown in FIG. 6, an amorphous carbon layer 212 having a thickness of 1-5 nm may be partially or completely recrystallized into a corrosion protection layer 208 comprising graphene. For the purposes of the present invention, the corrosion protection layer 208 may comprise multilayer graphene, graphitic carbon and mixed sp-2 and sp-3 bonded carbon materials with a thickness that is smaller than the thickness for corrosion protection of amorphous graphene.

Figure 7:
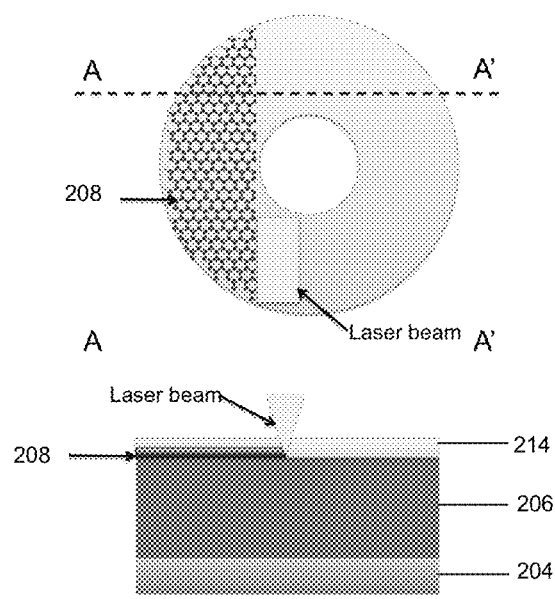
FIG. 7 shows a formation of a corrosion protection layer on a magnetic recording medium according to a particular embodiment of the present invention.

Another embodiment is shown in FIG. 7. In particular, a corrosion protection layer 208 is formed from an overcoat layer 214 provided on the surface of the magnetic layer 206. In this instance, the method 400 may comprise a further step of depositing an overcoat layer 214 on the surface of the magnetic layer 206 prior to the forming of step 406. The depositing of an overcoat layer 214 may be by any suitable method.

The overcoat layer 214 may be a lubricant layer. The overcoat layer 214 may comprise a polymer compound. The corrosion protection layer 208 may comprise graphene and may be formed utilising the carbon comprised in the polymer compound of the overcoat layer 214. In this embodiment, the mode of operating the laser beam may be similar to that as described in relation to FIG. 3. The environment may be held at a vacuum or in a gaseous environment that is inert and contains elements that are not decomposed to become reactive by the laser beam. The laser beam may be focused at the interface between the overcoat layer 214 and the surface of the magnetic layer 206. The fluence of the laser and the relative movement of the substrate 204 with respect to the laser beam spot may be controlled in a manner as to convert carbon from the polymer chains of the overcoat layer 214 into a corrosion protection layer 208 comprising graphene. The formation of the corrosion protection layer 208 through this growth method may result in a homogeneously transformed corrosion protection layer 208.

The corrosion protection layer 208 formed from the step 406 may have any suitable thickness. In particular, the step 406 comprises forming the corrosion protection layer 208 until the corrosion protection layer 208 has a thickness of 1.2 nm. In particular, the step 406 may be carried out until the thickness of the corrosion protection layer 208 formed is about 0.5-1.2 nm, 0.6-1.1 nm, 0.7-1.0 nm, 0.8-0.9 nm. Even more in particular, the thickness may be about 0.8-1.2 nm. In particular, the forming of step 406 comprises forming a corrosion protection layer comprising graphene and/or BN.

The corrosion protection layer 208 may comprise a single layer or multiple layers of the 2D material. If the corrosion protection layer 208 is formed as multiple layers, the different layers may be formed of the same or different 2D material.

Figure 8A:
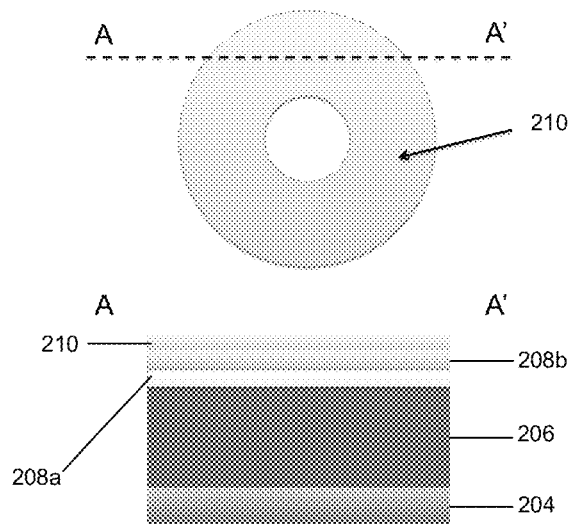
FIGS. 8A to 8C show a schematic layered structure of a magnetic device comprising multiple corrosion protection layers.

According to a particular aspect, the step 406 may comprise forming a corrosion protection layer 208 comprised of multiple layers on the surface of the magnetic layer 206. For example, the step 406 may comprise forming a first corrosion protection layer 208a followed by repeating the step 406 to form a second corrosion protection layer 208b on the first corrosion protection layer 208a. Optionally, an additional lubricant layer 210 may be provided on the second corrosion protection layer 208b. An example of a magnetic device comprising multiple corrosion protection layers is shown in FIG. 8A. In particular, there is provided a magnetic device comprising a first corrosion protection layer 208a which may be an insulating layer such as a BN layer and a second corrosion protection layer 208b comprising graphene.

Figure 8B:
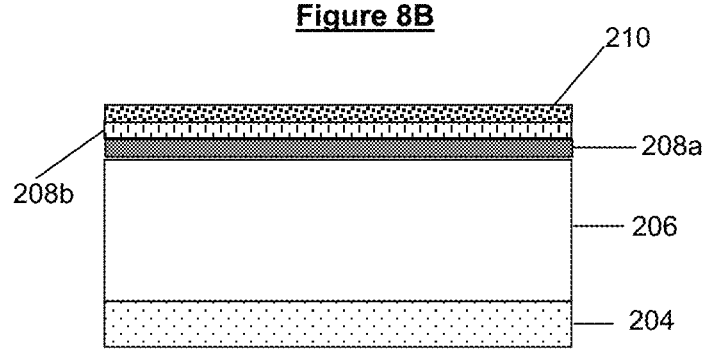
Figure 8C:
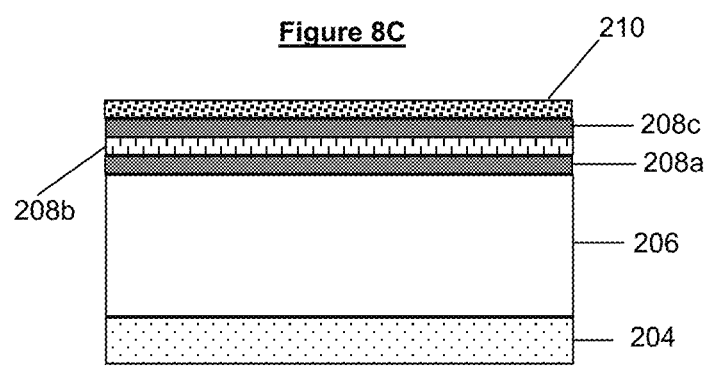

Other examples of magnetic devices comprising multiple corrosion protection layers which are formed using a method similar to that described in relation to FIG. 8A are provided in FIGS. 8B and 8C. In particular, FIG. 8B provides a magnetic device comprising a first corrosion protection layer 208a which may comprise graphene and a second corrosion protection layer 208b which may be an insulating layer such as a BN layer. In FIG. 8C, there is provided a magnetic device comprising a first corrosion protection layer 208a which may comprise graphene, a second corrosion protection layer 208b which may be an insulating layer such as a BN layer, followed by a third corrosion protection layer 208c which may comprise graphene. It would be clear to a skilled person that other combinations of different corrosion protection layers may be possible.

According to a particular aspect, the method 400 may optionally further comprise a step 408 of further processing the corrosion protection layer 208. The further processing of step 408 may comprise any suitable further processing of the corrosion protection layer 208. For example, the further processing of step 408 may comprise patterning, electrically contacting and/or functionalising the corrosion protection layer 208. The patterning, electrically contacting and/or functionalising may be by any suitable method. In particular, the functionalising may comprise molecular doping and/or chemical doping of the corrosion protection layer 208.

According to a particular aspect, the method may optionally further comprise a step 410 of depositing a lubricant layer on the corrosion protection layer. The lubricant layer may be as described above in relation to the lubricant layer 210. The depositing of the lubricant layer 210 may be by any suitable process. For example, the depositing of the step 410 may be by sputtering, ion beam deposition, pulsed laser ablation (PLD), filtered cathodic vacuum arc (FCVA) process, or the like. The step 410 comprises depositing the lubricant layer until the lubricant layer is of a suitable thickness. In particular, the step 410 may be carried out until the thickness of the lubricant layer 210 is about 1-4 nm.

In particular, the step 410 of depositing a lubricant layer 210 is optional because the corrosion protection layer 208 has significant benefits over conventional amorphous carbon overcoats for which the lubricant layer 210 is essential. The lubricant layer 210 is used for reducing friction between a read head and disc and also prevents mechanical damage, including scratching, of the magnetic disc. In the present invention, the corrosion protection layer 208 has a much lower friction coefficient compared to conventional amorphous carbon overcoats. In fact, the friction coefficient of the corrosion protection layer 208 may be similar to the friction coefficient of a lubricant layer and therefore, including an additional lubricant layer 210 will not further reduce friction during use. Further, since the corrosion protection layer 208 is durable to repeated abrasion from the magnetic head as compared to conventional amorphous carbon overcoats, the lubricant layer may not be required as minimal damage occurs to the corrosion protection layer 208.

The method of the present invention may be applied to existing magnetic devices or to future magnetic devices to achieve higher areal densities, as well as better protection against wear, corrosion and an increased thermal stability of the magnetic medium.

The advantage of the method of the present invention is that the use of 2D materials in the formation of the corrosion protection layer. 2D materials such as graphene and BN provide exceptional anti-corrosion properties despite only being provided as a thin layer on a surface of a magnetic layer. This has the further advantage of reducing the magnetic spacing since the overall thickness of the corrosion protection layer is reduced. Further, the method of the present invention enables the corrosion protection layer described above to be formed directly on the surface of the magnetic layer of the magnetic medium using a low temperature method without the need of further processing such as providing a nucleation layer for the formation of the corrosion protection layer or transferring from a growth substrate to the surface of the magnetic layer. This makes the method of the present invention more efficient and scalable. It also reduces the need for further consideration such as adhesion of the corrosion protection layer to the magnetic layer, removal of oxidation layers and removal of residues in the case of a corrosion protection layer which is transferred from a growth substrate to the magnetic layer. Such transfer processes also involve the risk of mechanical damage on the transferred layer such as transfer-induced wrinkles and cracks which would lead to an increase in the thickness of the corrosion protection layer and reduction in the ability to prevent corrosion of the magnetic layer.

Since the method of the present invention also utilises a low temperature method of forming the corrosion protection layer, integrity and magnetic properties of the magnetic recording medium is maintained. This is surprising since it is otherwise known for 2D materials to require high temperature growth conditions.

A second aspect of the present invention provides a magnetic recording medium comprising a substrate and a magnetic layer, wherein a surface of the magnetic layer is protected by a corrosion protection layer formed on the surface of the magnetic layer by the method of the first aspect. The magnetic recording medium, substrate, magnetic layer and corrosion protection layer may be as described above.

Whilst the foregoing description has described exemplary embodiments, it will be understood by those skilled in the technology concerned that many variations may be made without departing from the present invention. For example, the method described above can equally apply to providing a corrosion protection layer on a surface of the magnetic layer comprised in any magnetic device such as a magnetic tape drive or hard disk drive.

Having now generally described the invention, the same will be more readily understood through reference to the following examples which are provided by way of illustration, and are not intended to be limiting.

EXAMPLES

Example 1

Formation of Corrosion Protection Layer

A corrosion protection layer comprising graphene is formed on a 2.5" metallic disc typically used in hard disks. The disc is fixed on a stage and loaded into a vacuum chamber, which is evacuated to a pressure of 10-6 torr. The stage with the disc is heated to a temperature of about 200° C. and methane gas (CH4) is flowed into the vacuum chamber to maintain a constant process pressure of 1 torr. A 248 nm pulsed laser with 500 mJ fluence and 1 cm2 square beam spot is exposed on the surface of the disc with a 50 Hz frequency, with the stage at an angle of about 9° off parallel to the laser beam path. At this angle, the length of the laser beam spot fully covers the diameter of the disc. The disc is in constant motion such that the exposed surface to the laser beam is swept from the center to one edge of the disc over a duration of 5 minutes. As a result, half the surface of the disc is coated with a corrosion protection layer comprising graphene of nanocrystalline size grains. Finally, the methane gas is purged and the disc with half of its surface coated with a corrosion protection layer comprising graphene is removed from the vacuum chamber once the stage is cooled to room temperature.

Example 2

Anti-Corrosion Properties

Figure 9:
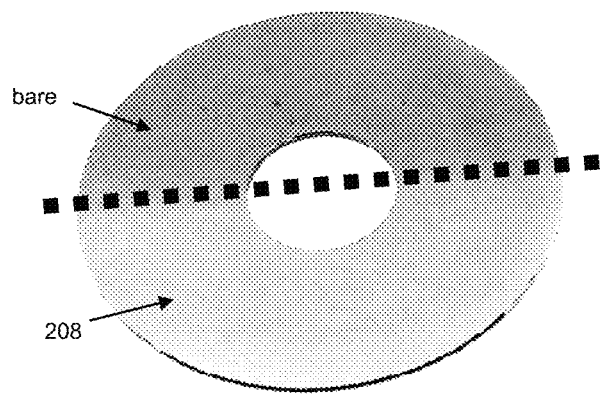
FIG. 9 shows a hard disk with a corrosion protection layer formed on part of its surface.

To test the anti-corrosion properties of the corrosion protection layer, the disc formed in Example 1 was transferred onto a hot plate and heated to a temperature of 300° C. in ambient conditions for 10 minutes. As shown in FIG. 9, the surface of the disc which was not coated with the corrosion protection layer became darker in colour as compared to the surface of the disc which was coated with the corrosion protection layer. The discolouration (i.e. darker colour) indicates that the surface underwent oxidation. Since the surface of the disc which was coated with the corrosion protection layer did not change colour, it shows that the corrosion protection layer is indeed able to prevent oxidation, and thus corrosion, on the disc surface.

The invention claimed is:

1. A method of protecting a surface of a magnetic layer of a magnetic recording medium comprising:
forming a corrosion protection layer directly on the magnetic layer, the corrosion protection layer comprising a two-dimensional (2D) material, wherein the forming is by laser-based chemical vapour deposition (laser-based CVD), wherein the laser-based CVD comprises injecting a gas into a vacuum chamber comprising the magnetic recording medium, dissociating bonds of the gas with energy of light from a pulsed laser beam having a wavelength of 190-400 nm to generate at least one decomposed species, and forming the corrosion protection layer from the at least one resulting decomposed species moving towards and growing on the magnetic layer, a fluence of the pulsed laser beam being such that a temperature of the magnetic layer is below 300° C.

2. The method according to claim 1, wherein the 2D material comprises graphene, boron nitride (BN) or a combination thereof.

3. The method according to claim 1, wherein the corrosion protection layer has a thickness between 0.5 nm and 1.2 nm.

4. The method according to claim 1, further comprising depositing a lubricant layer on the corrosion protection layer.

5. The method according to claim 1, further comprising patterning, electrically contacting and/or functionalising the corrosion protection layer.

6. The method according to claim 5, wherein the functionalising of the corrosion protection layer comprises molecular doping and/or chemical doping of the corrosion protection layer.

7. The method according to claim 1, wherein the gas is selected from
the group consisting of: $CH_4$, $C_2H_2$, $C_2H_4$, $C_2H_6$, $NH_3$, $B_2H_6$, $BCl_3$, $BF_3$, and a combination thereof.

8. The method according to claim 1, wherein the depositing is on a specific surface area of the magnetic layer irradiated by the laser beam having the wavelength of 190-400 nm.

9. The method according to claim 1, wherein the pulsed laser beam produces pulses of laser light having a pulse duration in a range of between 1 ns to 100 ns.

10. The method according to claim 1, wherein the pulsed laser beam produces pulses of laser light having a fluence of each pulse between 10-100 millijoules/cm$^2$.

11. The method according to claim 1, further comprising: controlling a position of the pulsed laser beam; and irradiating each part of the magnetic layer with a predetermined number of pulses to form the corrosion protection layer.

12. The method according to claim 1, wherein depositing the at least one decomposed species on the magnetic layer comprises forming a nucleation site on the surface of the magnetic layer, wherein the pulsed laser beam is irradiated as a laser beam spot on the magnetic layer, and wherein the method further comprises: guiding the laser beam spot across the surface of the magnetic layer; and growing the corrosion protection layer outwards based on the guiding of the laser beam spot across the surface of the magnetic layer.

13. The method according to claim 1, further comprising: providing relative movement between the pulsed laser beam and the substrate during the forming.

14. The method according to claim 1, comprising guiding the pulsed laser beam at an angle between parallel and perpendicular relative to the surface of the magnetic layer.

15. The method according to claim 1, further comprising: forming at least a portion of the corrosion protection layer on the surface of the magnetic layer that is not irradiated by the pulsed laser beam in response to the decomposing.

16. The method according to claim 15, further comprising: providing relative movement between the magnetic layer and the pulsed laser beam during the decomposing.

17. The method according to claim 1, wherein the magnetic layer is held at a temperature not exceeding 300° C. for 1 second-10 minutes.

18. The method according to claim 1, wherein the vacuum chamber is set to maintain a pressure of $1.0 \times 10^{-3}$ torr or lower.

19. The method according to claim 1, wherein the fluence of the pulsed laser beam on the magnetic layer is lower than an ablation threshold for graphene ablation.

\* \* \* \* \*